United States Patent [19]

Niebling et al.

[11] Patent Number: 4,684,021
[45] Date of Patent: Aug. 4, 1987

[54] BOTTOM LOADING WAFER CARRIER BOX

[75] Inventors: Tracy J. Niebling, Minneapolis; Walter I. Bieger, St. Paul, both of Minn.

[73] Assignee: Fluoroware, Inc., Chaska, Minn.

[21] Appl. No.: 877,336

[22] Filed: Jun. 23, 1986

[51] Int. Cl.$^4$ .............. B65D 85/30; B65D 81/00; B65D 57/00
[52] U.S. Cl. ................ 206/334; 206/328; 206/454; 206/521; 206/453
[58] Field of Search .......... 206/328, 334, 454, 521, 206/453

[56] References Cited

U.S. PATENT DOCUMENTS

| | | | |
|---|---|---|---|
| 3,644,033 | 2/1972 | Frystak et al. | 206/454 X |
| 3,701,558 | 10/1972 | Baker . | |
| 3,861,733 | 1/1975 | Mey | 206/328 X |
| 3,939,973 | 2/1976 | Wallestad | 206/328 |
| 3,949,891 | 4/1976 | Butler et al. | 214/301 |
| 4,043,451 | 8/1977 | Johnson | 206/334 |
| 4,176,751 | 12/1979 | Gillissie | 206/328 X |
| 4,248,346 | 2/1981 | Johnson | 206/334 |
| 4,520,925 | 6/1985 | Johnson | 206/334 |
| 4,555,024 | 11/1985 | Voss et al. | 206/334 X |
| 4,557,382 | 12/1985 | Johnson | 206/334 |
| 4,588,086 | 5/1986 | Coe | 206/334 X |

OTHER PUBLICATIONS

Geany et al., "Self-Sealing Shake-Proof Carrier" IBM Tech Disclosure Bulletin, vol. 19, No. 6, 11/1976, p. 2070.
Proposal for Standard Spec. for SMIF, 9/4/84.
"SMIF: A Technology for Wafer Cassette Transfer in VLSI Manufacturing" Parihl et al 12/1985.
"Critical Issues for VLSI Manufacturing," 12/1985.
SMIF and its Impact on Cleanroom Automation, Gunzwardena et al, 9/1985.

Primary Examiner—William Price
Attorney, Agent, or Firm—Palmatier & Sjoquist

[57] ABSTRACT

A bottom loading wafer carrier box provides a cavity which appropriately may have a still and particulate free environment for a wafer carrier handling silicon wafers during their storage, transport, and transfer into and out of processing equipment for the manufacture of semiconductors. The box includes a housing enclosing the cavity with an open bottom suitable for receiving the wafer carrier into the cavity. A releaseable door is provided for sealing the open bottom from the ambient environment about the housing of the box. A cam bar is slideably connected to the outside of the housing and operably connected to a moveable slider extending within the cavity. The slider has a carrier catch adapted for retaining the wafer carrier within the cavity and a cushion to retain the wafers within the carrier and to reduce the effects of shock upon the wafers. A grippable handle suitably extends from the cam bar so that the handle is operably connected to the slider to manually actuate engagement of the catch with the carrier and the cushion with the wafers.

25 Claims, 9 Drawing Figures

U.S. Patent  Aug. 4, 1987  Sheet 1 of 4  4,684,021
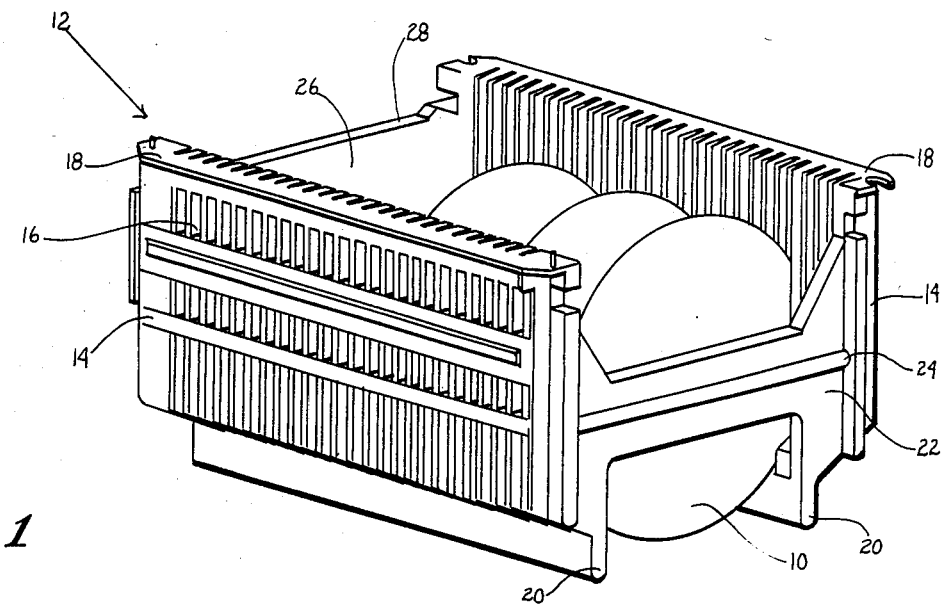
Fig.1
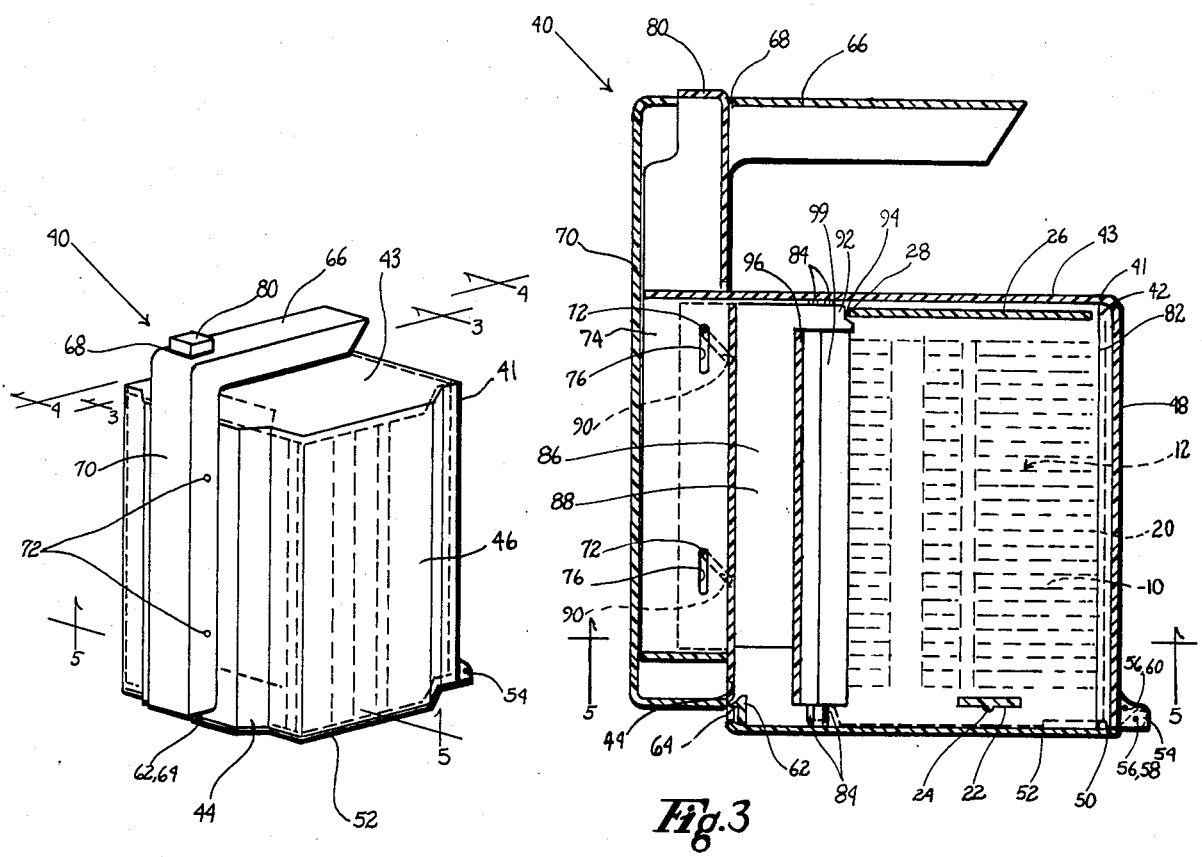
Fig.2
Fig.3

BOTTOM LOADING WAFER CARRIER BOX

BACKGROUND OF THE INVENTION

The invention relates to wafer carriers for handling silicon wafers used in the manufacture of semiconductors, and more particularly to a bottom loading wafer carrier box which provides a cavity which appopriately may have a still and particulate free environment for the wafer carrier and wafers.

Characteristic of the semiconductor manufacturing process is low yield. One reason for such low yields is particulate contamination of the wafers during their processing. Semiconductors have small wiring lines and spaces therebetween as minute as four microns. Foreign particulates not only may cause unwanted electrical bridges between such wiring lines, but also may cause electrical failures due to induced ionization or trapping centers in gate dialectrics or junctions. Therefore, keeping particulates and dust away from the silicon wafers during semiconductor manufacturing is vital because the circuitry etched thereon is extremely fine and a single particulate can ruin an entire semiconductor.

People, by shedding of skin flakes and hairs, are found to be a significant source of foreign particulates that form electrical bridges and are easily ionized thereby causing the defects. To control such particulate sources, the industry trend has been to build elaborate and expensive clean rooms with circulating air filter systems to obtain acceptable particulate-free levels of cleanliness.

Additionally, clean room garmets, including hoods and masks, are also commonly worn by clean room technicians to reduce particulate emissions into the clean rooms. Nonetheless, as many as six thousand particles per minute are still emitted into an adjacent cubic foot of clean room space by a fully suited technician or operator.

SUMMARY OF THE INVENTION

A bottom loading wafer carrier box provides a cavity which appropriately may have a still and particulate free environment for a wafer carrier handling silicon wafers during their storage, transport, and transfer into and out of processing equipment for the manufacture of seimconductors. The box includes a housing enclosing the cavity with an open bottom suitable for receiving the wafer carrier into the cavity. A releaseable door is provided for sealing the open bottom from the ambient environment about the housing of the box. A cam bar is slidably connected to the outside of the housing and operably connected to a moveable slider extending within the cavity. The slider has a carrier catch adapted for retaining the wafer carrier within the cavity and a cushion to retain the wafers within the carrier and to reduce the effects of shock upon the wafers. A grippable handle suitably extends from the cam bar so that the handle is operably connected to the slider to manually actuate engagement of the catch with the carrier and the cushion with the wafers.

In operation, the door is fully opened and the box is lowered into or onto processing equipment. The handle is forced downwardly effectively moving the cam bar downwardly which in turn moves the slider outwardly towards the cam bar thereby disengaging the carrier catch with the carrier and withdrawing the cushion from touching engagement with the wafers. Thereafter, the box may be lifted away from about the carrier.

The present invention advantageously isolates silicon wafers from people and the working environment during storage, transport, and transfer into and out of processing equipment which will reduce particulate contamination, improve semiconductor yield and productivity and increase the effectiveness of technicians as well as profits.

The box is simple and inexpensive to manufacture and may be used with existing facilities and equipment to thwart the rate of facility and equipment obsolescence with minimal capital and operating costs.

Most importantly, the wafer carrier box makes the semiconductor working environment much less restrictive thereby improving working conditions and operator comfort with no apparent detrimental effects on cost and yield for a simple nominal investment.

BRIEF DESCRIPTION OF THE DRAWINGS

FIG. 1 is an isometric view of a wafer carrier for handling silicon wafers;

FIG. 2 is an isometric view of the bottom loading wafer carrier box;

FIG. 3 is a cross-sectional view of the carrier box along lines 3—3 of FIG. 2 and FIG. 5;

DETAILED DESCRIPTION

Figure 4:
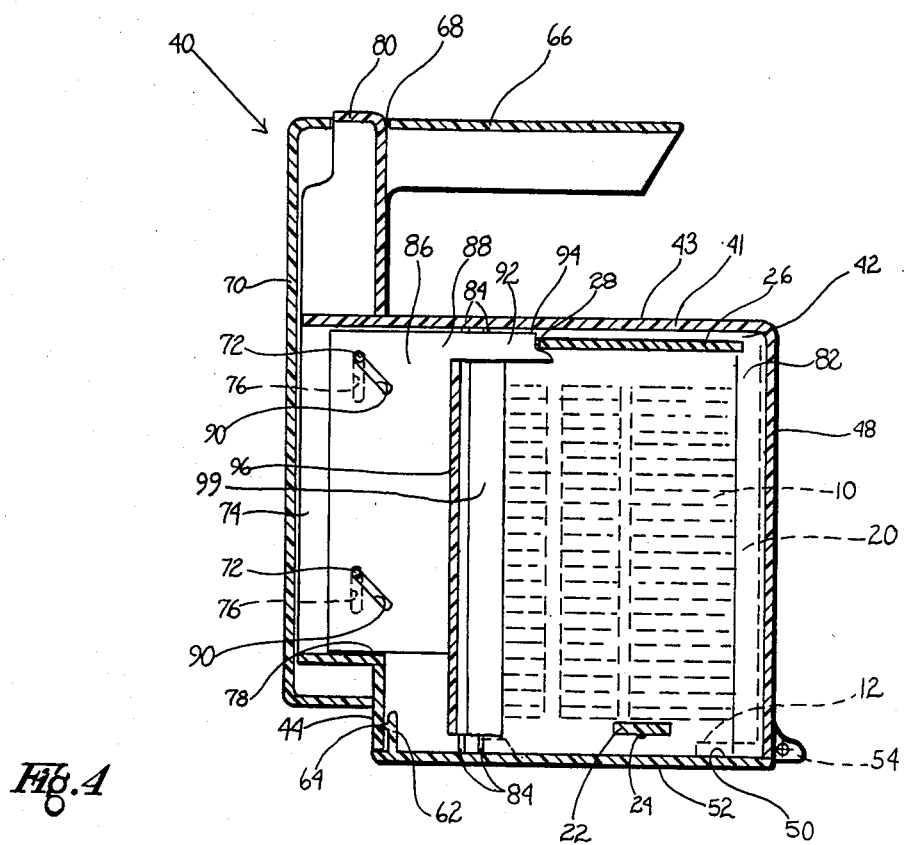
FIG. 4 is a cross-sectional view of the carrier box long lines 4—4 of FIG. 2 and FIG. 5.

Referring to FIG. 1, silicon wafers 10 are made of silicon and are typically round with varying diameters which generally may range from two to eight inches. Wafers 10 are preferably not to be touched by human hands or exposed to dust or foreign particulates which may settle thereon. Therefore, wafer carriers 12 are used in the semiconductor fabrication industry for storage, transport, and transfer of wafers 10 into and out of processing equipment. Wafer carriers 12 are also known as wafer cassettes or wafer baskets.

Wafer carrier 12 typically includes sidewalls 14 with ribs to hold the wafers parallel with respect to each other. Flanges 18 provide rigidity to carrier 12. Feet 20 are provided to support carrier 12 when it is upright and wafers 10 are in a vertical position. Indexing bar end wall 22 has indexing bar 24 which is commonly used to index carrier 12 onto or into various processing equipment. Sidewalls 14 are also interconnected by back wall 26 having a top edge 28.

Referring to FIGS. 2 through 5, the bottom loading wafer carrier box 40 of the invention is preferably made of a translucent polycarbonate material or the like which has low outgasing and particulate emission properties while permitting visual verification of box 40's contents.

Carrier box 40 includes housing 41 with internal cavity 42 surrounded by ceiling 43, contoured front wall 44, contoured sidewalls 46 and back wall 48. Carrier box 40 is preferably constructed to closely resemble a wafer carrier 12 in outward appearance. The overall shape of carrier box 40 is to aid in wafer carrier 12 insertion into carrier box 40. Wafer carrier 12 alignment with and insertion into carrier box 40 has been found to be easier when box 40 is contoured similar to carrier 12 as opposed to a more square flat wall construction. Also, the contoured construction of carrier box 40 will minimize the volume of cavity 42.

Carrier box 40 also has a bottom opening 50 leading into cavity 42 with a door 52 for suitably closing and sealing the bottom opening 50 from the ambient environment about housing 41 of box 40. Dust/particulate seals, suitably made of resilient materials such as silicone, may be used to aid in the sealing arrangement between door 52 and housing 41. Door 52 may be connected and thereby releaseable from housing 41 by a conventional hinge 54. A detent 56, including dimple 58 and depression 60, may be used to hold door 52 open once it is swung away from bottom opening 50 to its fully opened position adjacent back wall 48. Door 52 may also have a conventional door latch 62 while housing 41 has a cooperating door catch 64 to secure door 52 to housing 41 when in its closed position.

A grippable handle 66 is suitably located above ceiling 43 and preferably is rigidly connected or integral with elongate cam bar 70 which is slideably connected to front wall 44 in a vertical fashion described hereinbelow. Cam bar 70 is appropriately U-shaped in cross-section and preferably has two parallel pins 72 transversely passing therethrough. Grippable handle 66 also has a projecting thumb landing opening 68.

Contoured front wall 44 appropriately has a pair of vertically oriented, elongate cam bar supporting flanges 74, each with a pair of elongate vertically aligned slots 76. The pairs of slots 76 are preferably parallel with respect to each other. Cam bar supporting flanges 74 have an elongate slider opening 78 therebetween. Cam bar 70 fits over flanges 74 and is slidably retained thereat by pins 72 passing through vertically aligned slots 76. Projecting thumb landing 80 suitably extends upwardly from cam bar supporting flanges 74 thereby being rigidly connected to housing 41 and projects through thumb landing opening 68 o grippable handle 66.

Follower or slider 86 is located between cam bar supporting flanges 74 and extends through elongate slider opening 78 into cavity 42. Slider 86 preferably includes parallel panels 88, each with a pair of obliquely oriented elongate slots 90. The pairs of slots 90 are preferably parallel with respect to each other. Handle 66 and cam bar 70 are operably connected to slider 86 by pins 72 passing through obliquely oriented elongate slots 90 as well as cam bar supporting flange slots 76.

Slider 86 has extending legs 92 which project inwardly from parallel panels 88. Each leg 92 has a carrier catch 94 at its distal end. Cushion plate 96 is appropriately mounted transversely onto the inner edges of parallel panels 88 having parallel and opposing cushion retaining grooves 98. Elongate resilient cushions 99, suitably made of hollow extruded silicone rubber or the like, are appropriately mounted in cushion retaining grooves 98.

Cushions 99 are preferably resilient to absorb any shock forces that may be exerted on the edges of wafers 10 to thereby minimize wafer 10 breakage when carrier box 40 is moved, bumped or dropped. Also, cushions 99 are appropriately spaced apart wider than the flat edge portion (FIG. 5) of wafer 10 to allow for upward wafer flat orientation of wafers 10 as well as to accommodate wafer carrier 12 size tolerances and to avoid striking unseated wafers 10 during the loading of carrier 12 into box 40.

Figure 5:
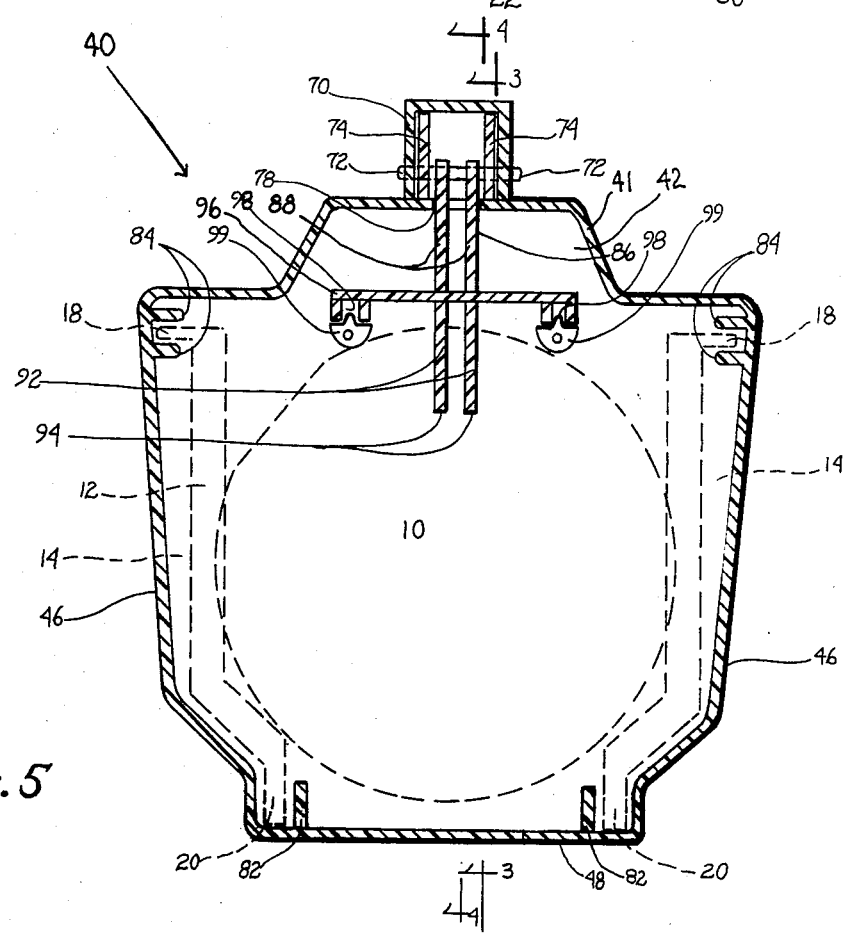
FIG. 5 is a cross-sectional view of the wafer carrier box taken along lines 5—5 of FIG. 2 and FIG. 3.

As may more clearly be seen in FIG. 5, the internal cavity 42 of housing 41 has a pair of parallel and opposing wafer carrier foot guides 82 and wafer carrier flange guides 84. The contoured shape of carrier box 40 and carrier foot and flange guides 82 and 84 cooperate together to aid the operator in aligning carrier box 40 onto and over wafer carrier 12 as carrier 12 is inserted into cavity 42. By this arrangement, carrier box 40 may be aligned over carrier 12 by feel as well as sight thereby assuring smooth sliding engagement of box 40 and carrier 12 without much chance of misalignment or jamming.

Guides 82 and 84 are preferably spaced apart to effectively hold fully inserted wafer carrier 12 permitting only minimal carrier 12 movement with respect to the housing 41 to aid in the prevention of wafer 10 breakage. The spacing of guides 82 and 84 should also accommodate slight wafer carrier 12 size tolerances.

Referring to FIGS. 4 through 8 sequentially, the operation of the bottom loading wafer carrier box 40 may be seen. Wafer carrier 12 is initially shown within carrier box 40 and its removal from box 40 is described herein.

When wafer carrier 12 is in its static position within carrier box 40, its flanges 18 are securely held by wafer carrier flange guides 84 while carrier feet 20 are similarly held by wafer carrier feet guides 82 (FIG. 4). Carrier catches 94, extending from parallel panels 88 via legs 92, engage and hold the back wall 26 of carrier 12 to prohibit any sliding movement of carrier 12 within cavity 42 whether door 51 is in its opened or closed position.

Elongate resilient cushions 99 touch and preferably exert a slight force on the edges of horizontally oriented wafers 10 to thereby protectively hold them within wafer carrier 12 while carrier 12 is within box 20. By this arrangement, wafers 10 within wafer carrier 12 are securely held within an isolatable cavity 42.

Figure 6:
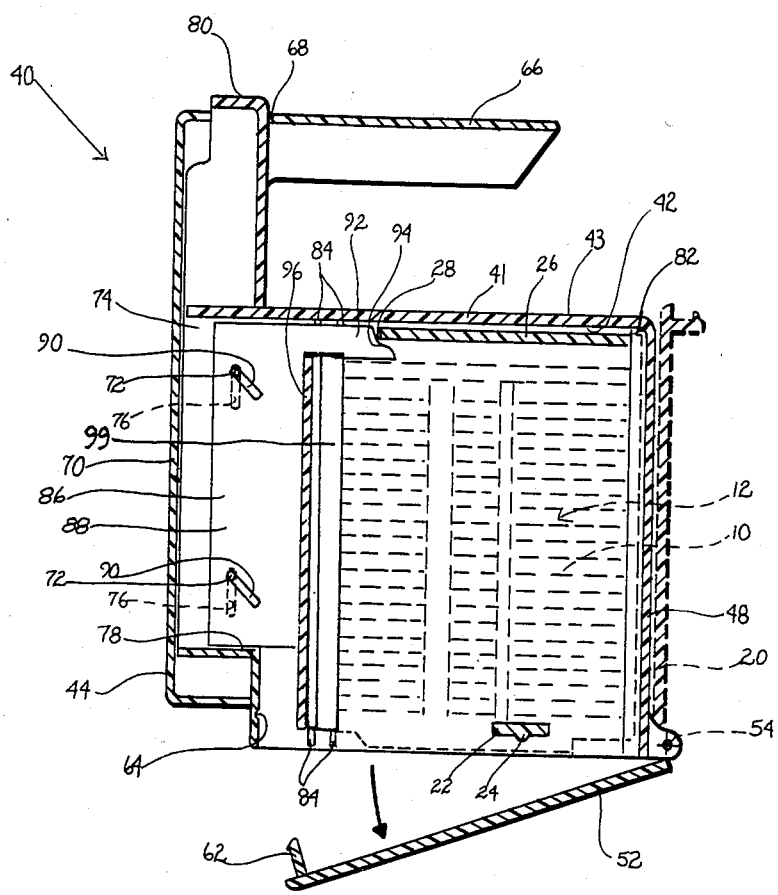
FIG. 6 is a cross-sectional view similar to FIG. 4 with the door partially opened showing its fully opened position in broken outline.

Referring to FIG. 6, to remove the wafer carrier 12 from the bottom loading wafer carrier box 40, door 52 is initially opened by releasing latch 62 from catch 64. Door 52 is then swung downwardly (arrow) and then upwardly on hinge 54 to its open position adjacent back wall 48 (broken outline) until detent 56 is engaged and door 52 is held fully opened. Carrier box 40 is then lowered onto a flat surface or onto a suitable processing equipment station typically used in the processing of silicon wafers into semiconductors.

Figure 7:
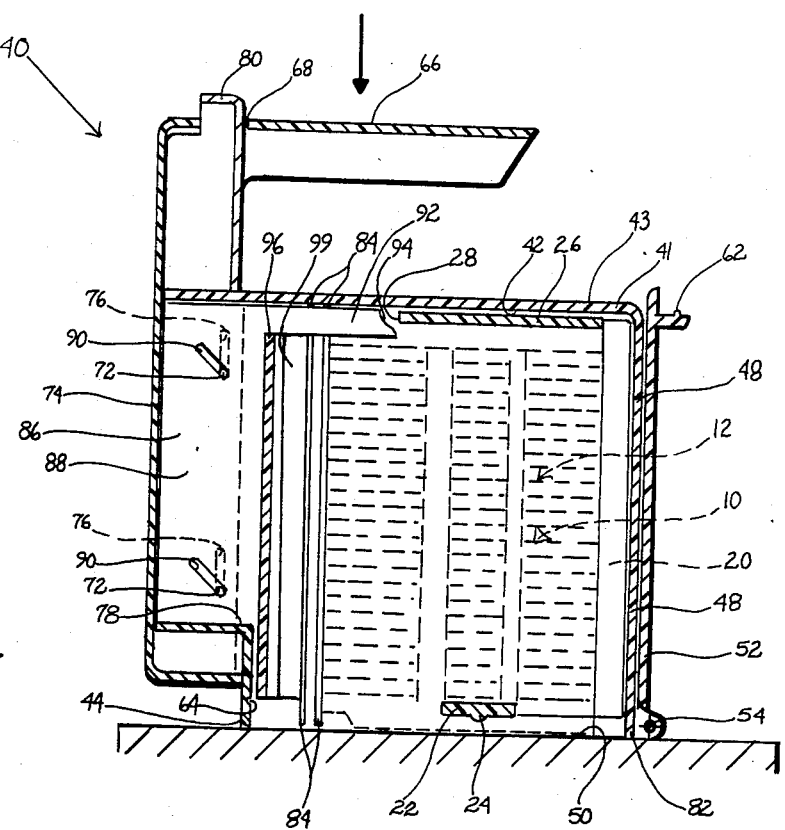
FIG. 7 is a cross-sectional view similar to FIG. 4 with the wafer carrier being released from within the cavity of the carrier box.
Figure 8:
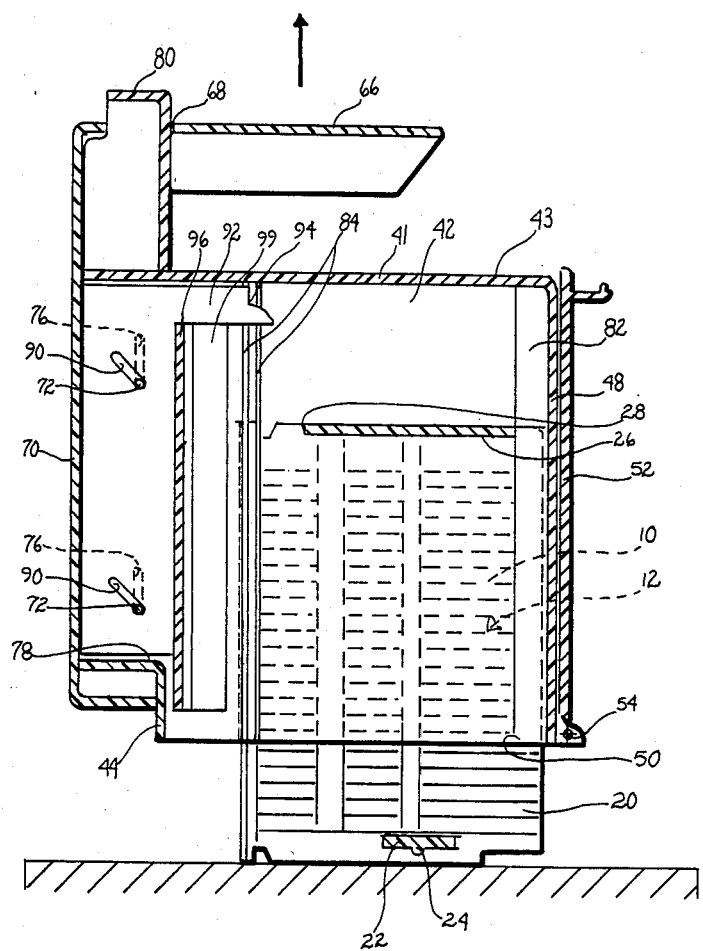
FIG. 8 is a view similar to FIG. 4 with the wafer carrier being removed from the carrier box.

As shown in FIG. 7, the operator next exerts a downward force (arrow) on handle 66 which slides downwardly simultaneously with elongate cam bar 70. As cam bar 70 moves downwardly, transverse pins 72 move vertically downward in vertical slots 76 located in cam bar supporting flanges 74. Pins 72 also move downwardly along the bottom surface of obliquely oriented elongate slots 90 which are situated in parallel panels 88 of slider 86. The pin 72 movement within oblique slots 90 moves slider 86 laterally outward through slider opening 78 in a direction towards cam bar 70 and away from wafer carrier 12 and wafers 10. Hence, carrier catches 94 are disengaged from the top of edge 28 of back wall 26 while elongate resilient cushions 99 are withdrawn from touching engagement with the edge of wafers 10. The wafer carrier 12 is now no longer restrained within wafer box 40. Box 40 may now be lifted upwardly (arrow) and away from wafer carrier 12 as shown in FIG. 8.

Loading wafer carrier 12 into carrier box 40 is the reverse operation of lowering box 40 over carrier 12 as in the position shown in FIG. 7. Thereafter, handle 66 is lifted upwardly while a greater downward force is exerted on thumb landing 80 to keep box 40 on its supporting surface until wafer carrier 12 is secured within box 40. The downward force is also necessary to overcome the frictional forces created by moving cam bar 68 and its pins 72 within vertical slots 76 of flanges 74 and within oblique slots 90 of slider 86 to thereby move carrier catches 94 and cushions 99 into engagement with wafer carrier 12 and wafers 10, respectively. Thereafter, carrier box 40 may be removed from the flat surface or processing equipment station. Door 52 may next be swung into its closed and secured position.

Figure 9:
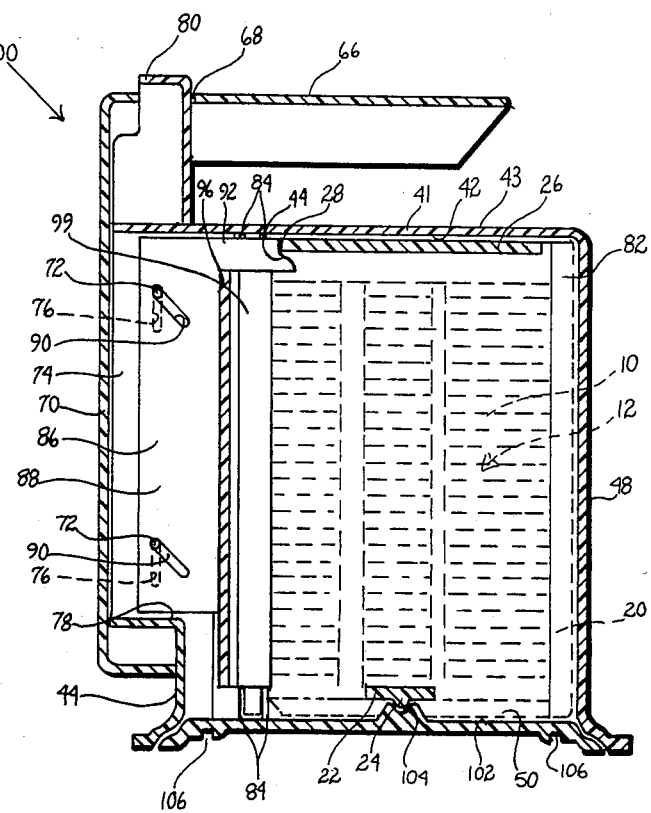
FIG. 9 is a cross-sectional view of the carrier box similar to FIG. 4 with a modified door.

Referring to FIG. 9, a second embodiment of bottom loading wafer carrier box 100 shows a modified door 102 with an inner carrier indexing bar notch 104 for carrier indexing bar 24 and external pin holes 106 for indexing door 102 onto a matching surface. This box 100 and door 102 arrangement may be used in processing equipment that is partially enclosed within a canopy similar to a miniature clean room. Such a canopy would have a port door in its ceiling that would index with pin holes 106 of door 102. This canopy and equipment arrangement is commonly referred to in the industry as a Standard Mechanical Interface (SMIF).

The present invention may be embodied in other specific forms without departing from the spirit or essential attributes thereof. Therefore, the illustrated embodiments should be considered in all respects as illustrative and not restrictive, reference being made to the appended claims rather than to the foregoing description to indicate the scope of the invention.

We claim:

1. A bottom loading wafer carrier box with a housing defining a cavity which appropriately may have a still and particulate free environment for a wafer carrier handling silicon wafers which are used in the manufacture of semiconductors, comprising:
   (a) an open bottom in the housing suitable for receiving the wafer carrier into the cavity;
   (b) a releaseable door for closing the open bottom and sealing the cavity from the ambient environment about the housing of the box;
   (c) an operable carrier catch within the housing for retaining the wafer carrier within the cavity of the housing; and
   (d) control means operably connected to the carrier catch for acutating engagement of the catch with the carrier.

2. The bottom loading wafer carrier box of claim 1, wherein the control means comprises a cam bar slidably connected to the outside of the housing and a movable slider operably connected to the cam bar extending within the housing having the carrier catch extending therefrom.

3. The bottom loading wafer carrier box of claim 1 further comprising an operable wafer cushion within the housing operably connected to the control means to retain the wafers within the carrier and to reduce the effects of shock upon the wafers.

4. A bottom loading wafer carrier box with a housing defining a cavity which appropriately may have a still and particulate free environment for a wafer carrier handling silicon wafers which are used in the manufacture of semicondutors, comprising:
   (a) an open bottom in the housing suitable for receiving the wafer carrier into the cavity;
   (b) a releaseable door for closing the open bottom and sealing the cavity from the ambient environment about the housing of the box;
   (c) a cam bar slidably connected to the outside of the housing; and
   (d) a movable slider extending within the cavity with an operable carrier catch adapted for retaining the wafer carrier within the cavity of the housing and a cushion and to retain the wafers within the carrier and to reduce the effects of shock upon the wafers, the cam bar being operably connected to the slider to actuate engagement of the catch with the carrier and the cushion with the wafers.

5. The bottom loading wafer carrier box of claim 1 wherein the housing is made of a translucent material to permit visual verification of the contents of the box.

6. The bottom loading wafer carrier box of claim 2, further comprising a grippable handle extending from the cam bar.

7. The bottom loading wafer carrier box of claim 1 wherein the door is hingedly attached to the housing.

8. The bottom loading wafer carrier box of claim 1 wherein the door is detachable from the housing.

9. The bottom loading wafer carrier box of claim 2 wherein the housing has a front wall with a centrally located, vertically oriented elongate slider opening and an elongate cam bar supporting flange adjacent the opening.

10. The bottom loading wafer carrier box of claim 9 wherein the cam bar is U-shaped in cross-section for fitting over the flange and covering the opening.

11. The bottom loading wafer carrier box of claim 1, further comprising alignment guides on the inside of the housing for guiding the wafer carrier into the cavity and effectively holding the fully inserted wafer carrier to permit only minimal movement of the fully inserted carrier within the cavity.

12. The bottom loading wafer carrier box of claim 9 wherein the cam bar supporting flange has a vertically oriented elongate slot wherein a transversely oriented pin affixed to the cam bar extends therethrough for slidably connecting and supporting the cam bar onto the housing.

13. The bottom loading wafer carrier box of claim 9 wherein the slider has an obliquely oriented elongate slot wherein a transfersely oriented pin affixed to the cam bar extends therethrough for operably connecting the cam bar to the slider.

14. The bottom loading wafer carrier box of claim 6, further comprising a projecting thumb landing adjacent the handle rigidly connected to the housing.

15. The bottom loading wafer carrier box of claim 3 wherein the cushion is suitably made of a resilient material such as extruded silicone rubber.

16. The bottom loading wafer carrier box of claim 1 wherein the carrier catch is engageable with the back wall of the wafer carrier.

17. The bottom loading wafer carrier box of claim 1, further comprising sealing means for sealing the door to the housing adjacent the open bottom.

18. The bottom loading wafer carrier box of claim 2 wherein the slider comprises a panel extending within the cavity in the direction of the wafer carrier with the carrier catch extending therefrom and engageable with the back wall of the wafer carrier and further comprising a transversely oriented cushion plate affixed to the panel with a wafer cushion affixed thereon.

19. The bottom loading wafer carrier box of claim 7 wherein the door has a latch operatively interlockable with a door catch on the housing for securing the door in a closed position and wherein the hinge has a detent for holding the door in an open position.

20. The bottom loading wafer carrier box of claim 1 wherein the housing is contoured to closely resemble the shape of a wafer carrier to aid in alignment and insertion of the carrier into the box and to minimize the volume of the cavity within the housing.

21. A bottom loading wafer carrier box with a housing defining a cavity which appropriately may have a still and particulate free environment for a wafer carrier handling silicon wafers which are used in the manufacture of semicondutors, comprising:
  (a) an open bottom in the housing suitable for receiving the wafer carrier into the cavity and wherein the housing has a front wall with a centrally located vertically oriented elongate opening and an elongate flange adjacent the opening with a vertically oriented elongate slot therein;
  (b) a releasable door for closing the open bottom and sealing the cavity from the ambient environment about the housing of the box;
  (c) a cam bar slidably connected to the elongate flange via a transversely oriented pin fixed in the cam bar and passing through the slot in the flange, the cam bar being adapted for covering the opening; and
  (d) a movable slider extending through the elongate opening in the housing with an obliquely oriented elongate slot wherein the pin of the cam bar passes therethrough operably connecting the cam bar to the slider, the slider having a carrier catch extending from the slider engageable with a back wall of the wafer carrier and a resilient wafer cushion to retain the wafers within the carrier and to reduce the effects of shock upon the wafers.

22. The bottom loading wafer carrier box of claim 21 wherein the housing is made of a translucent material to permit visual verification of the contents of the box.

23. The bottom loading wafer carrier box of claim 21 wherein the door is hingedly attached to the housing.

24. The bottom loading wafer carrier box of claim 21 wherein the door is detachable from the housing.

25. The bottom loading wafer carrier box of claim 21, further comprising a grippable handle extending from the cam bar.

* * * * *

UNITED STATES PATENT AND TRADEMARK OFFICE
CERTIFICATE OF CORRECTION

PATENT NO. : 4,684,021

DATED : August 4, 1987

INVENTOR(S) : Tracy J. Niebeling

It is certified that error appears in the above-identified patent and that said Letters Patent is hereby corrected as shown below:

ON THE TITLE PAGE, INVENTOR'S NAME SHOULD READ

-- Tracy J. Niebeling --.

Signed and Sealed this

Second Day of August, 1988

Attest:

DONALD J. QUIGG

Attesting Officer      Commissioner of Patents and Trademarks